United States Patent
Ye et al.

[11] Patent Number: 5,968,847
[45] Date of Patent: Oct. 19, 1999

[54] PROCESS FOR COPPER ETCH BACK

[75] Inventors: Yan Ye, Campbell; Diana Xiaobing Ma, Saratoga, both of Calif.

[73] Assignee: Applied Materials, Inc., Santa Clara, Calif.

[21] Appl. No.: 09/042,146

[22] Filed: Mar. 13, 1998

[51] Int. Cl.$^6$ .............................. H01L 21/00; B44C 1/22
[52] U.S. Cl. .......................... 438/734; 216/67; 216/78; 438/720; 438/742
[58] Field of Search .................................. 438/672, 720, 438/734, 742; 216/18, 67, 78

[56] References Cited

U.S. PATENT DOCUMENTS

| | | | |
|---|---|---|---|
| 4,298,443 | 11/1981 | Maydan | 204/192 E |
| 5,186,718 | 2/1993 | Tepman et al. | 29/25.01 |
| 5,320,728 | 6/1994 | Tepman | 204/192 |
| 5,387,315 | 2/1995 | Sandhu | 156/646 |
| 5,569,627 | 10/1996 | Shinohara et al. | 438/720 X |
| 5,578,166 | 11/1996 | Hirota | 156/643.1 |

FOREIGN PATENT DOCUMENTS 5-275388  10/1993  Japan .

OTHER PUBLICATIONS

A. Aliouchouche et al., "Laser Chemical etching of copper films", *SPIE*, vol. 2403, pp. 425–434 (1995).

L. R. Allen et al., "Tungsten plug etchback and substrate damage measured by atomic force microscopy", *J. Vac. Sci. Technol.* B, vol. 13, No. 3 (May/Jun. 1995).

(List continued on next page.)

*Primary Examiner*—William Powell
*Attorney, Agent, or Firm*—Shirley L. Church

[57] ABSTRACT

In the preparation of semiconductor structures having multilevel copper conductive features which must be interconnected, it is frequently desired to remove portions of a copper layer deposited over a substrate. In particular, where lines and contacts are created by depositing a copper layer to fill trenches and vias present in a dielectric layer, it is desired to remove the portion of the copper layer which does not form the desired line or contact. The present invention provides a method of etching a copper layer (film) to remove the portion of the film which is not part of the desired conductive interconnect structure, while avoiding over etching of the structure and the formation of corrosive surface contaminants on the surface of the etched copper. The method of etching is referred to as the etchback process, since, in a typical fabrication process, the deposited copper layer is etched back to the upper or "field" surface of a substrate containing trenches and vias which are filled by the copper. The copper layer etchback may be conducted on a substrate surface using a low temperature regime, below about 150° C. Within this low temperature regime, the etchback is preferably conducted using essentially physical bombardment of the copper surface. Or, the etchback may be carried out with the substrate surface at a temperature which falls within a high temperature regime, above about 150° C. Within this high temperature regime, three different etch chemistries may be used. The etch plasma may be formed solely from non-reactive gases; the etch plasma may be formed solely from gases which are produce a reactive species (such as a gas which is a source of chlorine or fluorine), or, the etch plasma may be formed from a combination of non-reactive and reactive gases which are tailored to adjust selectivity and etch rate. When the gas is a source of chlorine or fluorine, it is preferred that the gas be a compound comprising at least one other element in combination with chlorine or fluorine.

23 Claims, 7 Drawing Sheets

OTHER PUBLICATIONS

A. Bertz et al., "Effects of the biasing frequency on RIE of Cu in a $Cl_2$–based discharge", *Applied Surface Science*, 91, pp. 147–151 (1995).

D. Débarre et al., "The role of gas–phase in the laser etching of Cu by $Ccl_4$", *Applied Surface Science*, 96–98, pp. 453–456 (1996).

T. Gessner et al., "Copper Metallization Technology", pp. 1–23.

B. J. Howard et al, "Reactive ion etching of copper in $SiCl_4$–based plasmas", *Appl. Phys. Lett.*, 59(8), pp. 914–916 (Aug. 19. 1991).

Y. Igarishi et al., "High Reliablity Copper Interconnects through Dry Etching Process", *Extended Abstracts of the 1994 International Conference on Solid state Devices and Materials*, Yokohama, pp. 943–945 (1994), Y. Igarishi et al., "Thermal Stability of Interconnect of TiN/Cu/TiN Multilayered Structure", *Jpn. J. Appl. Phys.*, vol. 33. pp. 462–465 (1994).

Y. Igarishi et al., "Dry Etching Technique for Subquarter––Micron Copper Interconnects", *J. Electrochem. Soc.*, vol. 142, No. 3, pp. L36–L37 (Mar. 1995).

A. Jain et al., "Thermal dry–etching of copper using hydrogen peroxide and hexafluoracetylacetone", *Thin Solid Films*, 269, pp. 51–56 (1995).

A. Mak et al., "An Integrated Tungsten Plug Fabrication Process", Conference Proceedings ULSI–VII, Materials Research Society, pp.453–462 (1992).

H. Miyazaki et al., "Copper dry etching using $Cl_2$ gas as a single reactant and its application to ULSI", Semi Technology Symposium (Japan), Session 5, pp. 41–43 (Dec. 1996).

H. Miyazaki et al., "Copper dry etching with precise wafer-temperature control using $Cl_2$ gas as a single reactant", *J. Vac. Sci. Technol.* B 15(2), pp. 237–240 (Mar./Apr. 1997).

K. Ohno et al., "Reactive Ion Etching of Copper Films in a $SiCl_4$, $N_2$, $Cl_2$, and $NH_3$Mixture", *J. Electrochem. Soc.*, vol. 143, No. 12 (Dec. 1996).

K. Ohno et al., "Reaction Ion Etching of Copper Films in $SiCl_4$ and $N_2$ Mixture", *Japanese Journal of Applied Physics*, vol. 28, No. 6, pp. L1070–L1072 (Jun. 1989).

Y. Ohshita et al., "Lower temperature plasma etching of Cu using IR light irradiation", *Thin Solid Films*, 262, pp. 67–72 (1995).

S. M. Rossnagel and J. Hopwood, "Metal ion deposition from ionized magnetron sputtering discharge", *J. Vac. Sci. Technol.* B,vol. 12, No. 1, pp. 449–453 (Jan./Feb. 1994).

S. M. Rossnagel et al., "Thin, high atomic weight refractory film deposition for diffusion barrier, adhesion layer, and seed layer applications",*J. Vac. Sci. Technol.* B, vol. 14, No. 3 pp. 1819–1827 (May/ Jun. 1996).

G. C. Schwartz et al.,*J. Electrochem. Soc.*, vol. 130, No. 8, pp. 1777–1779 (Aug. 1983).

S. Seo et al., "Characteristics of an Inductively Coupled $Cl_2$/Ar Olasma and Its Application to Cu Etching", *Electrochemical Society Proceedings*, vol. 95–4, pp. 327–338 (1995).

W. Sesselman et al., "The Interaction of Chlorine with Copper. I. Adsorption and surface reaction", *Surface Science*, 176, pp. 32–66 (1986).

W. Sesselman et al., "The Interaction of Chlorine with Copper. II. Bulk diffusion", *Surface Science*, 176, pp. 67–90 (1986).

C. Steinbruchel, "Patterning of Copper for Multilevel Metallization: Reactive Ion Etching and Chemical–Mechanical Polishing", *Applied Surface Science*, 91, pp. 139–146 (1995).

J. Torres, "Advanced Copper Interconnections for Silcon CMOS Technologies", *Applied Surface Science*, 91, pp. 112–123 (1995).

H. Winters, "Etch products from the reaction on $Cl_2$with Al(100) and Cu(100) and $XeF_2$ with W(111) and Nb", *J. Vac. Sci Technol.*, B3(1), pp. 9–15 (Jan./Feb. 1985).

H. Winters, "The etching of Cu(100) with $Cl_2$",*J. Vac. Sci. Technol.*, A3(3), pp. 786–790 (May/Jun. 1985).

Y. Ye et al., "0.35–Micron and Sub–0.35–Micron Metal Stack Etch in a DPS Chamber—DPS Chamber and Process Characterization", *Electrochemical Society Proceedings*, vol. 96–12, pp. 222–233 (1996).

U.S. Patent Application, Serial No. 08/869,798 of Ye et al., filed Jun. 5, 1997.

U.S. Patent Application, Serial No. 08/891,410 of Ye et al., filed Jul. 9, 1997.

U.S. Patent Application, Serial No. 08/911,878 of Ye et al., filed Aug. 13, 1997.-

FIG. 11 ription># PROCESS FOR COPPER ETCH BACK

BACKGROUND OF THE INVENTION

1. Field of the Invention

The present invention pertains to a plasma etch process for the removal of excess copper film deposition, to form copper interconnects (including lines and plugs which reside in trenches and vias, respectively). The process may be carried out in a variety of plasma chamber designs and may be optimized by the selection of particular etch chemistry.

2. Brief Description of the Background Art

In the multi level metallization architecture used in present day semiconductor devices, aluminum is generally used as the material of construction for interconnect lines and contacts. Although aluminum offers a number of advantages in ease of fabrication, as integrated circuit designers focus on transistor gate velocity and interconnect line transmission time, it becomes apparent that copper is the material of choice for the next generation of interconnect lines and contacts. In particular, when the aluminum wire size becomes smaller than 0.5 $\mu$m, the electromigration resistance and the stress migration resistance of aluminum becomes a problem area. In addition, when the feature size of an aluminum-based contact requires an aspect ratio of greater than 1:1, it is difficult to obtain planarization of the substrate during the application of the next insulating layer over the contact area of the substrate. Further, the resistivity of copper is about 1.4 $\mu\Omega$cm, which is only about half of the resistivity of aluminum.

One of the preferred technologies for the formation of copper lines and copperfilled contact vias (plugs) is known as the damascene process. In this technology, a typical process for producing a multilevel structure having feature sizes in the range of 0.5 micron ($\mu$m) or less would include: blanket deposition of a dielectric material; patterning of the dielectric material to form line trenches and via openings; deposition of a diffusion barrier layer and, optionally, a wetting layer to line the trenches and/or openings; deposition of a copper layer onto the substrate in sufficient thickness to fill the trenches and openings; and removal of excessive conductive material from the substrate surface. The known art suggests that excess conductive material is to be removed using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139–146.

Typically the copper layer deposition in the damascene process is by physical vapor deposition (PVD), by chemical vapor deposition (CVD), or by electroplating.

Regardless of the technique used to deposit copper, when CMP techniques are used to remove excess copper from the dielectric surface after deposition, there are several problems which arise. Copper is a soft material which tends to smear across the underlying surface during polishing. This may cause a variation in the critical dimensions of conductive features. Particles from the slurry used during the chemical mechanical polishing process may become embedded in the surface of the copper and other materials surrounding the location of the copper lines and contacts. The chemicals present in the slurry may corrode the copper, leading to increased resistivity and possibly even corrosion through an entire wire line thickness. Further, the chemical-mechanical polishing is a wet process which provides manufacturing difficulties.

Wet etch processes have been attempted for removal of the excess deposited copper; however, there is difficulty in controlling the etch profile, particularly when the thickness of the film being etched is comparable to the minimum pattern dimension. Over etching at particular locations on the substrate surface due to isotropic etching may make the process impractical. In addition, there is the potential for extreme corrosion of the copper line or plug during the etch process itself.

Plasma etchback techniques have previously been used for the formation of tungsten plugs used in an interconnect system in combination with aluminum. A description of this technology is provided in an article by Lynn R. Allen and John M. Grant, entitled "Tungsten plug etchback and substrate damage measured by atomic force microscopy", J. Vac. Sci. Technol. B 3(3), pp. 918–922, May/June 1995.

In addition, U.S. Pat. No. 5,387,315 to Gurtej S. Sandhu, issued Feb. 7, 1995, describes a process for deposition and etchback of copper in multilayered structures. However, this latter technology is limited to a particular system where the copper deposition is by CVD and a decomposition product from the CVD reaction is subsequently used as the etchant for the etchback step.

A major concern in the etchback process is the need for selectivity in etching of the conductive layer over etching of the underlying wetting (adhesion) and barrier layers, as well as over the dielectric field surface underlying the conductive layer. For example, a useful plasma etchback process for copper should preferably be highly selective toward copper over both the tantalum or tantalum/tantalum nitride (which frequently is used as the barrier layer lining trenches or contact vias) and the silicon dioxide (which typically forms the field dielectric).

The etch rate should be rapid, to maximize the throughput rate through the equipment, but the process should avoid over etching of the copper layer in the area of the filled feature, so that the copper line or plug maintains its desired dimensions. In addition selectivity is important, as it is necessary to etch the copper layer without overetching adjacent barrier layers and substrate surfaces. Typically, the barrier layer used with copper is tantalum or tantalum nitride and adjacent substrate surfaces are silicon dioxide or a "low K dielectric" such as BCB (divinylsiloxane bis-benzocyclobutene) or FPI (fluorinated polyimide).

Until very recently copper etch rates obtained by purely physical bombardment were typically about 300 Å–500 Å per minute or less, as described by Schwartz and Schaible, *J. Electrochem. Soc.*, Vol. 130, No. 8, p. 1777 (1983) and by H. Miyazaki et al., *J. Vac. Sci. Technol. B* 15(2) p.239 (1997), respectively. Recently, in a related development (the subject matter of which is assigned to the assignee of the present invention) copper etch rates were improved using purely physical bombardment. Etch rates as high as 5,000 Å per minute were achieved. Further, using newly-developed technology which employs purely physical bombardment or chemically supplemented physical bombardment, the selectivity between copper and materials commonly used as adhesion layers, barrier layers, and dielectric layers has proved to be more than satisfactory. The physical bombardment technology, including chemical enhancement, is disclosed in detail in pending U.S. patent application Ser. No. 08/891,410, filed Jul. 9, 1997, which is hereby incorporated by reference in its entirety.

In addition to the physical bombardment technology, in another related development (the subject matter of which is assigned to the assignee of the present invention), directional pattern etching of copper was achieved in a manner which prevents the corrosion of adjacent copper surfaces.

Corrosion is often a major problem during device fabrication, as copper does not form any self passivating layer like aluminum does. Any residual etchant materials on the etched copper surface continue to corrode the surface after completion of the etch process. Typically, a chlorine-comprising gas is used in the reactive ion etch processing of the copper. Although the chlorine provides acceptable etch rates, it typically causes the copper to corrode rapidly due to the formation of reaction by-products which are not volatile. These byproducts remain on the copper surface, causing corrosion over the entire etched surface. The byproducts can be made volatile subsequent to the etch step by treatment with chemical species which create a volatile reaction product, but by this time the corrosion is already extensive. Further, in the case of copper interconnect lines, the whole wire line may corrode all the way through, resulting in a non-useable device and reducing manufacturing yields.

A process which permits directional copper etching while protecting adjacent surfaces from corrosion is described in U.S. patent application Ser. No. 08/911,878, filed Aug. 13, 1997, and is hereby incorporated by reference in its entirety. This process provides for the use of an etch chemistry which applies hydrogen to the etched surface to protect the surface from corrosion. Hydrogen is adsorbed on the copper exterior surface and may be absorbed into the interior of the copper, so that it is available to react with species which would otherwise penetrate that exterior surface and react with the copper interior to that surface. Although any plasma feed gas component comprising hydrogen, which is capable of generating sufficient amounts of hydrogen, may be used, the most preferred embodiment of the invention provides for the use of a component which contains both hydrogen and halogen. Preferred examples are hydrogen chloride (HCl) and/or hydrogen bromide (HBr), which are used as the principal source of the reactive species for etching copper. Preferably the HCl and/or HBr accounts for at least 40%, and more preferably at least 50%, of the reactive species feed to the etch process.

In the copper etch back process which is the subject matter of this invention, not only is it important to achieve advantageous etch rates while reducing corrosion of the copper surface of the etched layer, it is also important to selectively etch the copper while leaving the barrier layer structure and substrate adjacent the copper interconnect relatively undisturbed.

SUMMARY OF THE INVENTION

In the preparation of semiconductor structures having multilevel copper conductive features which must be interconnected, it is frequently desired to remove portions of a copper layer deposited over a substrate. In particular, where lines and contacts are created by depositing a copper layer to fill trenches and vias present in a dielectric layer, it is desired to remove the portion of the copper layer which does not form the desired line or contact. The present invention provides a method of etching a copper layer (film) to remove the portion of the film which is not part of the desired conductive interconnect structure, while minimizing the etching of adjacent barrier structures and substrate surfaces. In addition, it is important to avoid the formation of corrosive surface contaminants on the surface of the etched interconnect copper. The method of etching is referred to herein as the etchback process, since, in a typical fabrication process, the deposited copper layer is etched back to the upper or "field" surface of a substrate containing trenches and vias which are filled by the copper.

We have discovered a method of achieving the etchback of a copper layer in a manner which provides etch rates which are more than acceptable for large scale manufacturing; avoids the creation of a corrosive residue on the etched copper; and, which exhibits excellent selectivity for copper as compared to silicon oxide substrates and as compared with a barrier layer such as tantalum or tantalum nitride.

The copper layer etchback may be conducted on a substrate surface using a low temperature regime, below about 200° C. Preferably the substrate surface temperature is about 80° C. or less. Within this low temperature regime, the etchback is preferably conducted using essentially physical bombardment of the copper surface. The etchback is accomplished using a plasma, wherein said method comprises:

a) supplying to a plasma etch process chamber at least one gas which gas is chemically non-reactive with copper;

b) creating a plasma from the at least one gas in a manner which provides an uniform ion density across the substrate surface;

c) attracting ions and excited atoms from the plasma toward a substrate surface comprising a layer of copper by applying an offset bias to the substrate; and d) removing at least portions of the copper layer deposited on said substrate surface while maintaining portions of the copper layer interior of the substrate surface.

Preferably the plasma created in step b) above is sufficient to enable a copper etch rate of at least 1,000 Å per minute.

Typically the portion of the copper film deposited interior of a substrate is copper deposited into a trench or contact/via formed in a silicon dioxide substrate. Typically a barrier layer of tantalum or tantalum nitride is used as an interface between the copper and the silicon dioxide substrate, to prevent diffusion of the copper into the substrate.

During the etchback process, preferably there is a temperature difference between the substrate surface and the etch chamber surface of at least about 30° C.

To obtain a stable, uniform, and controllable plasma ion density, the apparatus used is preferably selected from the group consisting of: an apparatus having a device internal to the etch process chamber and located above the substrate surface which assists in plasma generation through inductive coupling; an apparatus having a device which supplies a plasma to the etch chamber from a source exterior to the etch chamber; an apparatus having a device located external to the etch chamber which assists in plasma generation through inductive coupling; and, a device which assists in plasma generation through capacitive coupling.

The most preferred apparatus includes a device internal to the plasma etch chamber and located above the substrate surface which assists in plasma generation through inductive coupling. See for example U.S. application Ser. No. 08/869, 798, filed Jun. 5, 1997, entitled "RF Plasma Etch Reactor With Internal Inductive Coil Antenna And Electrically Conductive Chamber Walls" which is hereby incorporated by referenced in its entirety. Another preferred apparatus is one where a microwave-generated plasma is supplied to the etch chamber from a remote source.

The device which creates the ion density may be operated in a manner which creates a pulsing of the plasma ion density, or may be operated in a manner which creates a pulsing of the substrate offset bias, or both.

A second method of conducting etchback of the copper layer is carried out with the substrate surface at a temperature which falls within a high temperature regime. The substrate surface temperature is above about 150° C., and typically ranging from greater than about 150° C. to about 400° C. Under the high temperature regime, three different etch chemistries may be used. The etch plasma may be formed solely from non-reactive gases; the etch plasma may be formed solely from gases which are produce a reactive species (such as a gas which is a source of chlorine or fluorine), or, the etch plasma may be formed from a combination of inert and reactive gases. Examples of non-reactive gases include argon, helium, nitrogen, xenon, methane, ethane, and propane. For purposes of the etch process, hydrogen is also considered to be a non-reactive gases. Examples of reactive gases, which may be used to provide essentially all or all of the plasma supply gas, include HCl, HBr, HI, $BCl_3$, $SiCl_4$, and combinations thereof. Preferably, when essentially all of the plasma supply gas is a reactive gas, the gas is HCl, or HBr, or HI, or a combination thereof. Examples of reactive gases which may be used in combination with inert gases to provide a plasma chemistry necessary to achieve a desired selectivity and to reduce the corrosion of etched copper surfaces include HCl, HBr, HI, $BCl_3$, $SiCl_4$, $CHF_3$, $CF_4$, $SF_6$, $Cl_2$, and combinations thereof.

The etchback is accomplished using a plasma etch chemistry, wherein said method comprises:

a) supplying to a plasma etch process chamber at least one gas, which gas is selected to provide the desired selectivity for copper over adjacent substrate materials while avoiding or reducing corrosion of the etched copper surface;

b) creating a plasma from the at least one gas described in step a) in a manner which provides a uniform ion density across the substrate surface;

c) attracting ions and excited atoms from the plasma toward the substrate surface by applying an offset bias to the substrate; and d) removing a first portion of a copper layer, which first portion is deposited on the substrate surface, while maintaining a second portion of the copper layer, which second portion is deposited interior of the substrate surface.

Preferably the plasma created in step b) above is sufficient to enable a copper etch rate of at least 1,000 Å per minute.

In a preferred embodiment, the etchback method utilizes two etch chemistries. A first etch chemistry for removal of the bulk portion of the copper layer overlying the substrate surface, and a second etch chemistry for removal of a small residual layer of copper to reach the substrate surface. Use of two etch steps in which different plasma etch chemistries are used enables the desired selectivity with respect to the copper and materials adjacent the copper; assists in the reduction of corrosive residue formation on etched copper surfaces; and aids in control of the amount of over etch (recess formation) of the copper within the interconnect structure. The two etch chemistries can be used in succession by merely changing the gas composition feed to the plasma etch chamber, but this is considered to be a two step etch because there are two etch chemistries utilized.

In such a method, the first etch step comprises:

a) supplying to a plasma etch process chamber at least one gas, which gas provides selectivity for copper over adjacent substrate materials;

b) creating a first plasma etch chemistry from the gases described in step a) in a manner which provides an uniform ion density across the substrate surface sufficient to enable a copper etch rate of at least 1,000 Å per minute;

c) attracting ions and excited atoms from the plasma toward the substrate surface by applying an offset bias to the substrate;

d) removing a first portion of a copper layer, which first portion is deposited on the substrate surface, while maintaining a second portion of the copper layer, which second portion is deposited interior of the substrate surface;

and the second etch step comprises:

e) altering the composition of the gases supplied to the etch chamber in step a) to provide a second etch plasma chemistry which comprises at least one gas, which etch plasma chemistry is designed to avoid or reduce corrosion of the etched copper surface;

f) attracting ions and excited atoms from the second etch plasma toward the substrate surface by applying an offset bias to the substrate; and g) removing any residual copper from the first portion of the copper layer, while essentially maintaining the second portion of the copper layer.

The step e) gases may be solely non-reactive gases which provide physical bombardment or may be mainly non-reactive gases containing less than about 50% reactive gases.

The most preferred plasma etch chemistry involves the use of essentially pure HCl, HBr, HI, or combinations thereof for the copper etchback process, as these gases provide an excellent copper etch rate, good selectivity for copper over the commonly used barrier layers of tantalum and tantalum nitride, and reduce the corrosion of the etched copper surface. The etch chemistry used may be adjusted to obtain selectivity for copper over adjacent substrate materials, as needed. In addition, process conditions such as process chamber pressure, power wattages to various plasma generation and substrate biasing elements, substrate surface temperature, and process chamber temperature may be adjusted to provide improvements in selectivity.

Preferably there is a temperature difference between the substrate surface and the etch chamber surface of at least about 30° C.

A further etch process may be used in combination with this latter method, to etchback any wetting layer (adhesion layer) or barrier layer material which extends above the field dielectric surface of the substrate after etching of the copper layer. Preferably the plasma source gases used for barrier layer removal are those which do not leave a corrosive residue on the etched copper surface.

To obtain the desired plasma ion density, the apparatus used to carry out the etchback can be selected from the same apparatus as described with reference to the low temperature regime etchback method.

BRIEF DESCRIPTION OF THE DRAWINGS

FIG. 7A shows the starting structure and FIG. 7B shows the structure after the copper etchback.

FIGS. 9A, 9B, and 9C illustrate in schematic a cross-sectional view of a preferred embodiment contact via structure as it progresses through etchback steps of a method which combines physical bombardment with use of an etchant species which is reactive with copper. FIG. 9A shows the starting structure. A more corrosive etchant is used initially for removal of the bulk copper in the layer to produce the structure shown in 9B. This etchant is replaced by a less corrosive etchant for removal of a thin layer of copper to break through to the tantalum nitride barrier layer, to produce the structure shown in FIG. 9C.

FIGS. 10A, 10B, 10C, and 10D illustrate in schematic a cross-sectional view of a preferred embodiment contact via structure as it progresses through the etchback steps of the method which combines physical bombardment with use of an etchant species which is reactive with copper. FIG. 10A shows the starting structure. A more reactive etchant is used initially to obtain a rapid removal of the bulk copper, producing the structure shown in FIG. 10B. This etchant is replaced by a less reactive etchant for removal of a thin layer of copper, to break through to the tantalum nitride barrier layer, as shown in FIG. 10C. And, finally, the tantalum nitride residing on the silicon dioxide field surface of the substrate is removed in a final etch step, to produce the structure shown in FIG. 10D.

DETAILED DESCRIPTION OF THE PREFERRED EMBODIMENTS

We have discovered a method, including a number of variations or embodiments, which permits the preparation of semiconductor structures having multilevel copper conductive features. In particular, we have developed process steps for the creation of copper lines and contacts in trenches and vias formed within a dielectric layer. We have invented techniques which permit the removal of portions of a deposited copper layer in a manner which provides a dielectric substrate surface which is free of residual copper, leaving copper in the trenches and contact/via structures.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or reactive species which is at least partially ionized, and a reference to "copper" includes alloys thereof.

Specific terminology of particular importance to the description of the present invention is defined below.

The term "anisotropic etching" refers to etching which does not proceed in all directions at the same rate. If etching proceeds exclusively in one direction (e.g. only vertically), the etching process is said to be completely anisotropic.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "bias power" refers to the power used primarily to control ion bombardment energy and the directionality of ions toward a substrate.

The term "copper" refers to copper and alloys thereof, wherein the copper content of the alloy is at least 80 atomic % copper. The alloy may comprise more than two elemental components.

The term "feature" refers to metal lines and openings on a substrate, and other structures which make up the topography of the substrate surface.

The term "ion bombardment" refers to physical bombardment by ions (and other excited species of atoms which are present with the ions) to remove atoms from a surface, where physical momentum transfer is used primarily to achieve the atom removal.

The term "isotropic etching" refers to an etching process where etching can proceed in all directions at the same rate.

The term "plasma" refers to a partially ionized gas containing an equal number of positive and negative charges, as well as some other number of non-ionized gas particles.

The term "source power" refers to the power used primarily to generate ions and neutrals whether directly in an etching chamber or remotely as in the case of a microwave plasma generator.

The term "substrate" includes semiconductor materials, glass, ceramics, polymeric materials, and other materials of use in the semiconductor industry.

The term "uniform ion density" refers to an ion density which varies less than about 10%, preferably, less than about 5%, across the wafer surface.

II. An Apparatus for Practicing the Invention

The etch process was carried out in a Centura® & Integrated Processing System available from Applied Materials, Inc. of Santa Clara, Calif. The system is shown and described in U.S. Pat. No. 5,186,718, the disclosure of which is hereby incorporated by reference. This equipment included a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996). The plasma processing chamber enables the processing of an 8 inch (200 mm) diameter silicon substrate surface.

Figure 1:
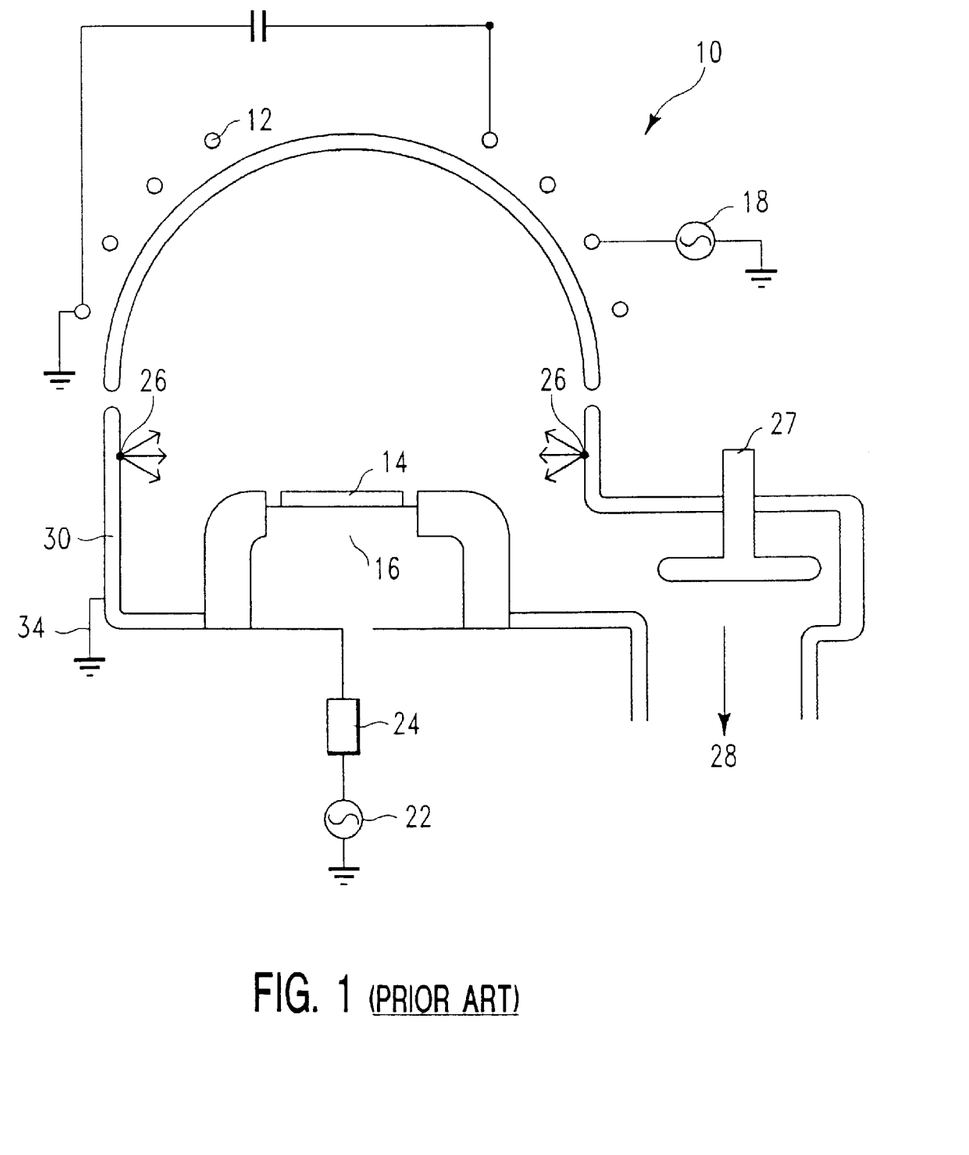
FIG. 1 is a schematic illustrating a decoupled plasma source (DPS) etching chamber of the kind used during the patterned etching of copper as described in the preferred embodiments of the present disclosure.

A schematic of the processing chamber is shown in FIG. 1A which shows an etching process chamber 10, which is constructed to include at least one inductive coil antenna segment 12 positioned exterior to the etch process chamber 10 and connected to a radio frequency (RF) power generator 18. Interior to the process chamber is a substrate 14 support pedestal 16 which is connected to an RF frequency power generator 22 through an impedance matching network 24, and a conductive chamber wall 30 which serves as the electrical ground 34 for the offset bias which accumulates on the substrate 14 as a result of the RF power applied to the substrate support pedestal 16 .

The semiconductor substrate 14 is placed on the support pedestal 16 and gaseous components are fed into the process chamber through entry ports 26. A plasma is ignited in process chamber 10 using techniques well known in the industry. Pressure interior to the etch process chamber 10 is controlled using a vacuum pump (not shown) and a throttle valve 27 connected to a process chamber gas exit line 28. The temperature on the surface of the etch chamber walls is controlled using liquid-containing conduits (not shown) which are located in the walls of the etch chamber 10. The temperature of the semiconductor substrate (typically a silicon wafer) was controlled by controlling the backside pressure of a heat transfer gas (typically helium) in contact with the side of the wafer which was not being processed (the wafer backside). For experimental purposes, it was desired to maintain the substrate temperature below about 150° C. during some etch steps and above 150° C. for other etch steps. The surface of the etching chamber 10 walls was maintained at about 80° C. using the cooling conduits previously described. In the case of a production process, preferably, the substrate support platen provides for backside heating or cooling of the substrate.

III. Achieving Copper Etch Back Using the Method of the Present Invention

The Examples provided below are intended to be illustrative of the inventive method of the invention and are not intended to limit the scope of the subject matter, as one skilled in the art, in view of applicants' disclosure, will be able to make further variations on the method steps described herein, to "fine tune" the method to a particular end use application.

As previously described, in the SUMMARY OF THE INVENTION, the copper layer etchback may be conducted with the substrate surface temperature falling within a low temperature regime, below about 150° C., or a high temperature regime, above about 150° C. (and typically between about 150° C. and about 400° C.). Each of these regimes are addressed in detail below.

Within the low temperature regime, the etchback is preferably conducted using essentially physical bombardment of the copper layer surface. Within the high temperature regime, three different etch chemistries may be used. The etch plasma may be formed solely from non-reactive gases; the etch plasma may be formed solely from gases which are produce a reactive species (such as a gas which is a source of chlorine or fluorine), or, the etch plasma may be formed from a combination of non-reactive and reactive gases. Examples of non-reactive gases include argon, helium, nitrogen, hydrogen, and xenon. Examples of reactive gases, which may be used to provide essentially all or all of the plasma supply gas, include HCl, HBr, HI, $BCl_3$, $SiCl_4$, and combinations thereof. Examples of reactive gases which may be used in combination with inert gases to provide a desired plasma chemistry include HCl, HBr, $BCl_3$, $CHF_3$, $CF_4$, $SF_6$, $Cl_2$, $SiCl_4$, and combinations thereof.

EXAMPLE ONE

Etch Rate

Figure 2:
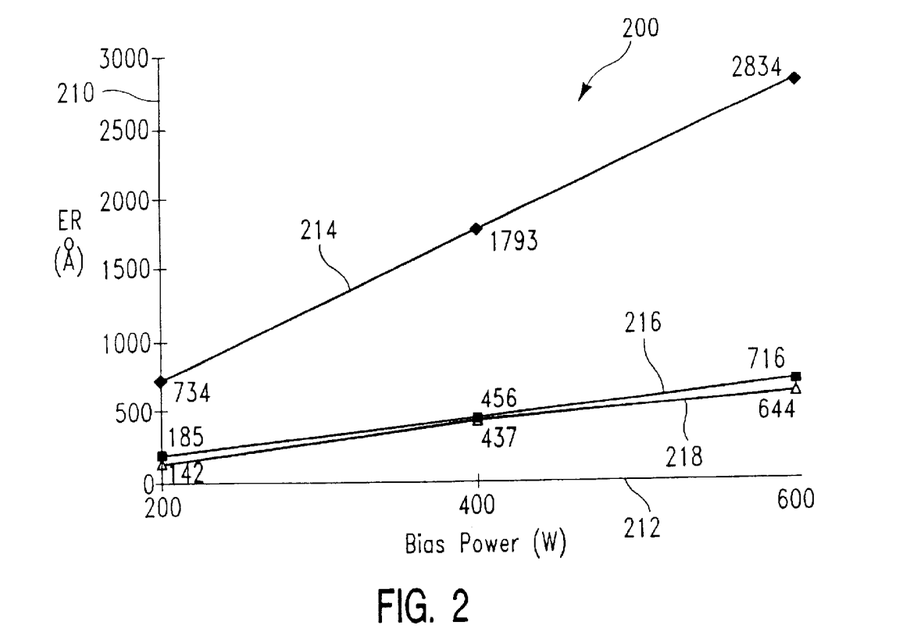
FIG. 2 is a graph showing the relative etch rates for copper, silicon dioxide and TEOS-generated silicon oxide in an argon plasma as a function of the substrate bias.

FIG. 2 shows a bar graph of copper etch rate data for the low temperature regime, where the substrate surface temperature was about 45° C. The plasma source power was about 1000 W at a frequency of about 2 MHz to the inductive coil antenna segment positioned exterior to the etch process chamber. The plasma source gas was argon which was fed to the etch process chamber at a rate of about 100 sccm. The etch process chamber pressure was about 10 mT, and the process chamber temperature was about 80° C. The etch rate, is shown in Angstroms (Å) per minute on graph scale 210 as a function of the bias power to the substrate support platen which is shown in Watts at a frequency of about 13.56 MHz on graph scale 212.

Curve 214 represents the etch rate for copper; Curve 216 represents the etch rate for silicon dioxide; and, Curve 218 represents the etch rate for TEOS created silicon oxide dielectric. It is readily apparent that a copper etch rate exceeding 1,000 Å per minute is easily achieved; and, although selectivity will be discussed in detail subsequently, the selectivity for copper over adjacent silicon dioxide or TEOS-generated dielectric substrate ranges from about 3.5:1 to about 4:1.

Figure 3:
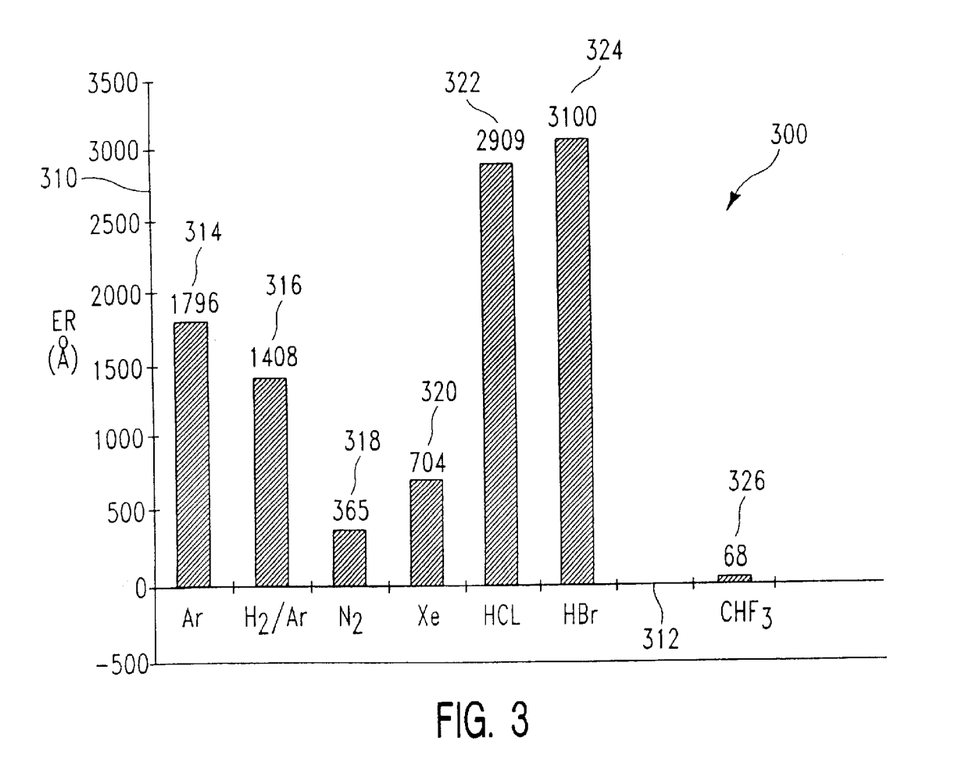
FIG. 3 is a bar graph showing the relative etch rate of copper as a function of the gas used to generate the etch plasma.

FIG. 3 shows a bar graph of copper etch rate data for the high temperature regime, where the substrate surface temperature was about 250° C. The plasma source power was about 1000 W at a frequency of about 2.0 MHz to the inductive coil antenna segment positioned exterior to the etch process chamber. The copper etch rate in Å per minute is shown on the graph scale labeled 310. The plasma source gas is shown on the graph scale labeled 312. Where the source gas was H2/Ar, the relative amounts of gas feed were 4 sccm of $H_2$ and 96 sccm of Ar. The overall gas feed rate for each gas shown was 50 sccm, with the exception of Ar, $H_2$/Ar and Xe, each of which was used at a gas flow rate of 100 sccm. The plasma source power was about 1000 W at a frequency of about 2 MHz to the inductive coil antenna segment positioned exterior to the etch process chamber. The bias power to the substrate support platen was about 400 W frequency of about 13.56 MHz, with the exception of Ar, $H_2$/Ar and Xe, each of which was used in combination with a substrate support platen bias power of about 200 W. The etch process chamber pressure was about 10 mT, and the process chamber temperature was about 80° C.

The copper etch rate, which is shown in Angstroms (Å) per minute on graph scale 310, clearly indicates that an etch rate in excess of 1,000 Å per minute is easily achievable for the non-reactive gases argon (labeled 314) and $H_2$/Ar (labeled 316). Non-reactive gases $N_2$ (labeled 318) and Xe (labeled 320) might require a higher bias power than 200 W, for example, to achieve the 1,000 Å per minute minimum desired copper etch rate.

The etch rate for reactive species-generating gases HCl (labeled 322) and HBr (labeled (324) is far in excess of the 1,000 Å per minute target etch rate. The etch rate for another reactive species-generating gas, $CHF_3$ (labeled 326), was minimal, at less than 100 Å per minute.

EXAMPLE TWO

Selectivity

Figure 4:
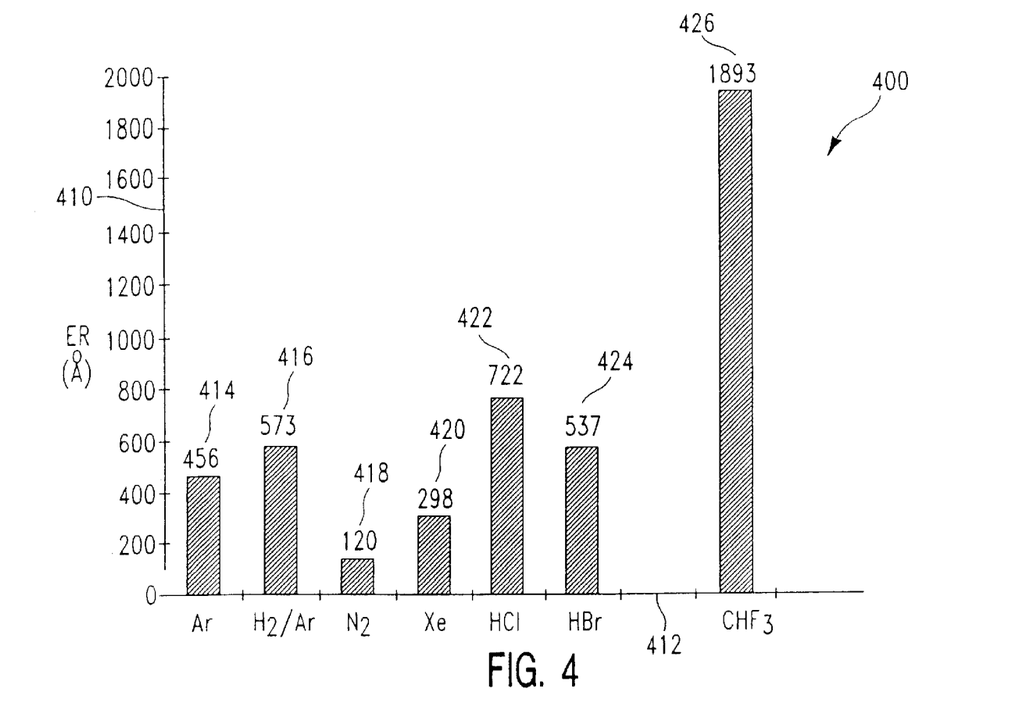
FIG. 4 is a bar graph showing the relative etch rate of silicon dioxide as a function of the gas used to generate the etch plasma.

FIG. 4 shows a bar graph of silicon oxide etch rate data for the low temperature regime, where the substrate surface temperature was about 45° C. The plasma source power was about 1000 W at a frequency of about 2.0 MHz. The silicon dioxide etch rate in Å per minute is shown on the graph scale labeled 410. The plasma source gas is shown on the graph scale labeled 412. Where the source gas was H2/Ar, the relative amounts of gas feed were 4 sccm of $H_2$ and 96 sccm of Ar. The overall gas feed rate for each gas shown was 50 sccm, with the exception of Ar, $H_2$/Ar, and Xe, each of which was used at a gas flow rate of 100 sccm. The bias power to the substrate support platen was about 400 W frequency of about 13.56 MHz, with the exception of $CHF_3$, which was used in combination with a substrate support platen bias power of about 200 W. The etch process chamber pressure was about 10 mT, and the process chamber temperature was about 80° C.

A comparison of the silicon dioxide etch rates on graph scale 410 with the etch rates for copper shown in FIG. 3 on graph scale 310 indicates that the selectivity for copper over silicon dioxide should range between about 2:1 to about 4:1 for inert gases, and between about 4:1 and 6:1 for HCl and HBr, respectively. In particular, the inert gases argon (labeled 414), $N_2$ (labeled 418) and Xe (labeled 420), as well as $H_2$/Ar show good selectivity for copper over silicon dioxide, while reactive gases HCl (labeled 422) and HBr (labeled (424) show excellent selectivity for copper over silicon dioxide.

Pure $CHF_3$ (labeled 426), etches the silicon dioxide far more rapidly than the copper, as expected.

Figure 5:
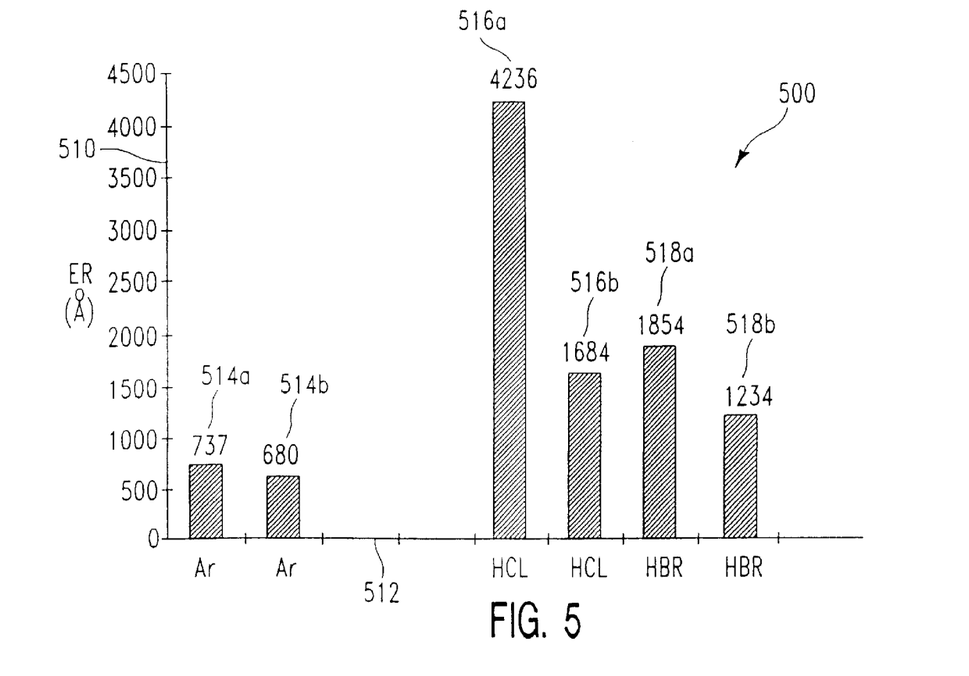
FIG. 5 is a bar graph showing the relative etch rates for tantalum wetting/barrier layer as a function of the gas used to generate the etch plasma.

FIG. 5 shows a bar graph of tantalum and tantalum nitride etch rate data for the low temperature regime, where the substrate surface temperature was about 45° C. The plasma source power was about 1000 W at a frequency of about 2.0 MHz. The etch rate in Å per minute is shown on the graph scale labeled 510. The plasma source gas is shown on the graph scale labeled 512. The gas feed rate for Ar in each case was 100 sccm, while the gas feed rate for HCl and HBr in each case was 50 sccm. The bias power to the substrate support platen was about 400 W frequency of about 13.56 MHz. The etch process chamber pressure was about 10 mT, and the process chamber temperature was about 80° C.

The etch rate for tantalum in the presence of the Ar plasma is represented by the bar labeled 514*a*, while the etch rate for tantalum nitride is represented by the bar labeled 514*b*. The etch rate for tantalum in the presence of the HCl plasma is represented by the bar labeled 516*a,* while the etch rate for tantalum nitride is represented by the bar labeled 516*b*. The etch rate for tantalum in the presence of the HBr plasma is represented by the bar labeled 518*a,* while the etch rate for tantalum nitride is represented by the bar labeled 518*b*.

A comparison of the copper etch rates from FIG. 3 with the tantalum and tantalum nitride etch rates from FIG. 5 indicates that the selectivity for copper over both tantalum and tantalum nitride is excellent in an argon plasma. The selectivity for copper over both tantalum and tantalum nitride is also excellent in an HBr plasma.

Figure 6:
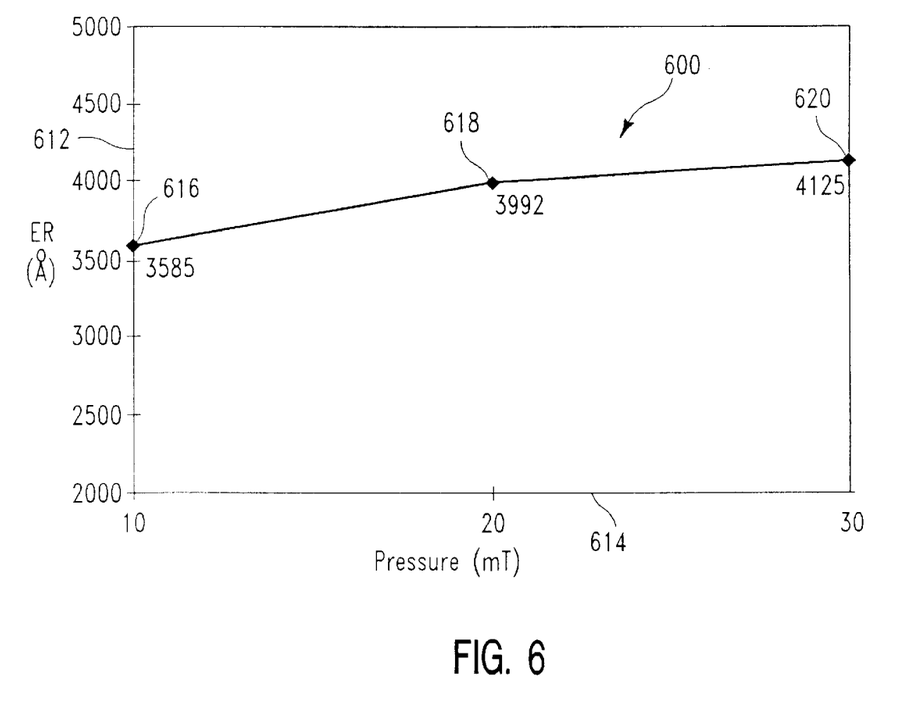
FIG. 6 is a graph showing the etch rate for copper using HCl plasma etch chemistry, as a function of the pressure in the plasma etch chamber.

Although the data for copper etch rate compared with tantalum in an HCl plasma indicates that the tantalum would tend to etch more rapidly than the copper, etch process conditions other than the plasma gas source can be adjusted to alleviate this potential problem. For example, FIG. 6 shows the etch rate for copper in an HCl plasma as a function of the etch process chamber pressure. The copper etch parameters were basically the same as they were with reference to FIG. 3, except that the plasma source power was 1200 W.

EXAMPLE THREE

Physical Bombardment Etchback

Figure 7A:
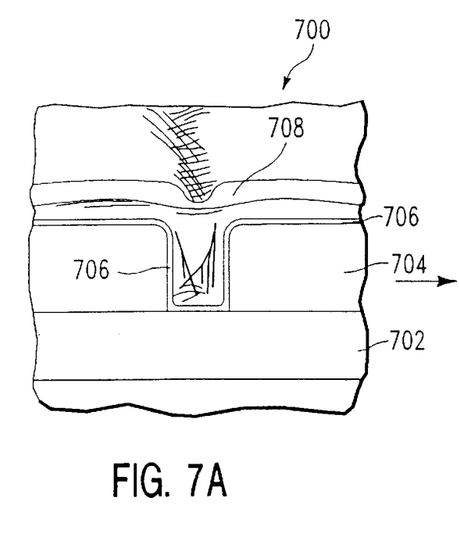
FIGS. 7A and 7B illustrate in schematic a cross-sectional view of a preferred embodiment contact via structure as it progresses through a physical bombardment etchback step which removes the copper layer to expose the silicon dioxide surface of the substrate, leaving a copper plug in the via.
Figure 7B:
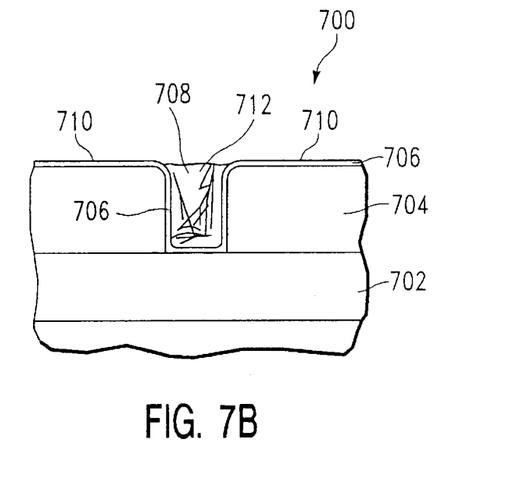

With reference to FIGS. 7A and 7B, these figures are illustrative of a preferred copper etchback process which is based on physical bombardment, without the use of an etch species which is chemically reactive with copper. The advantage of this method is that there are no residual corrosive residues on the copper surface nor on surfaces adjacent the copper surface. The sample was etched in the Centura® Integrated Processing System previously described. The view of the structure is a schematic of a cross-sectional side view. The contact via structure 700 was a contact via having a diameter of about 0.3 microns and an aspect ratio of about 3:1. The contact via 700 included a silicon underlayer 702, an overlying silicon dioxide dielectric layer 704, a tantalum nitride barrier layer 706 overlying silicon dioxide layer 704, and a copper fill layer 708 overlying barrier layer 706. To etch away the portion of copper layer 708 overlying the upper surface 710 of barrier layer 706, the etch conditions were as specified below. The plasma gas feed to the etch process chamber was about 100 sccm of argon; the process chamber pressure was 10 mTorr; the source power (power to the inductive coil used to create the plasma) was 1000 W at a frequency of 2 MHz; the bias power applied to the substrate support platen was about 500 W at a frequency of 13.56 MHz; and, the substrate surface temperature was approximately 40° C., while the etch chamber wall was about 80° C.

Figure 8:
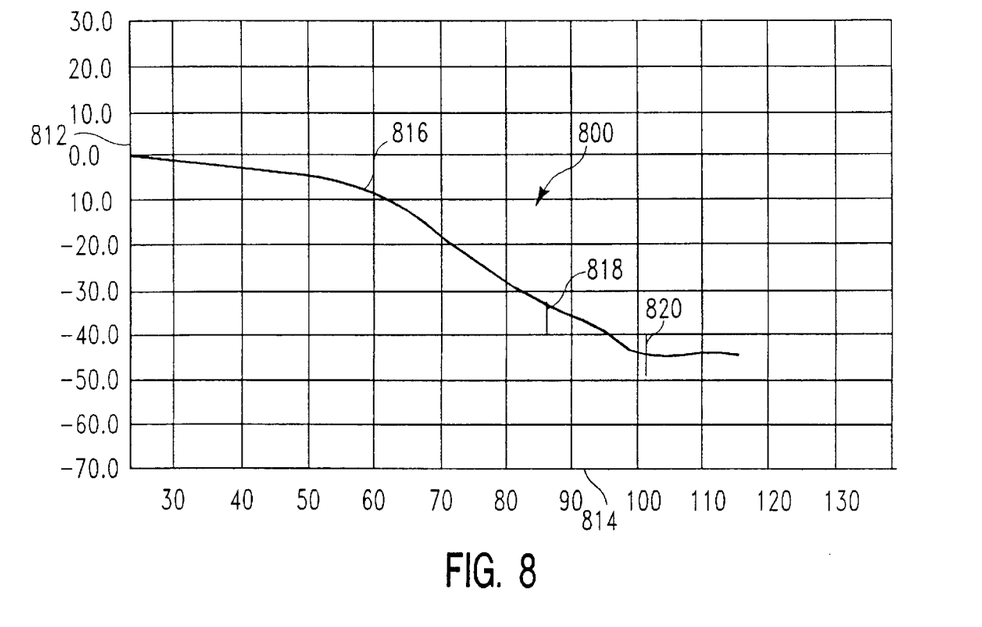
FIG. 8 is a graph showing the decrease in copper concentration in the vapor phase about 1 inch above the substrate surface as the etch progresses, for an etch process of the kind illustrated in FIGS. 7A and 7B. When the copper concentration in the vapor phase no longer changes, this generally means the copper has been removed from most substrate surface areas (other than the interconnect surfaces), and the etch process is stopped shortly thereafter.

The etch back process required about 100 seconds, as illustrated on FIG. 8, which illustrates the presence of copper emissions in the plasma area over the substrate surface. The copper concentration was monitored using an optical sensor measuring at a wavelength of about 3,250 Å. FIG. 8 shows a curve 800 representing the optical emission intensity 812 for copper appearing in the plasma, as a function of time 814 in seconds. The intensity reading for the copper dropped slowly for about the first 60 seconds, after which a more rapidly decline began, as portions of the upper surface 710 of barrier layer 706 were exposed. At about 100 seconds, the decrease in copper emissions stopped, indicating that the etch was completed. Using 90 seconds as the time for completion of etching, the calculated etch rate was about 3,000 Å per minute. Photomicrographs of the upper surface of the structure show a clean tantalum nitride upper surface 710, with the copper plug 712 being slightly depressed (about 0.07 microns below the upper surface 710.

EXAMPLE FOUR

Reactive Species Etchback

Figure 9A:
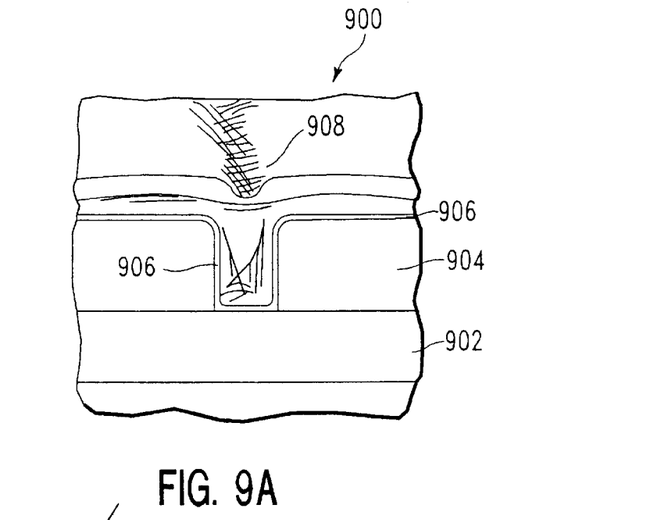
Figure 9B:
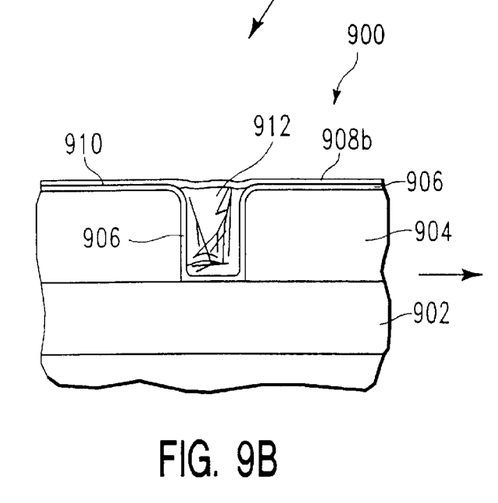
Figure 9C:
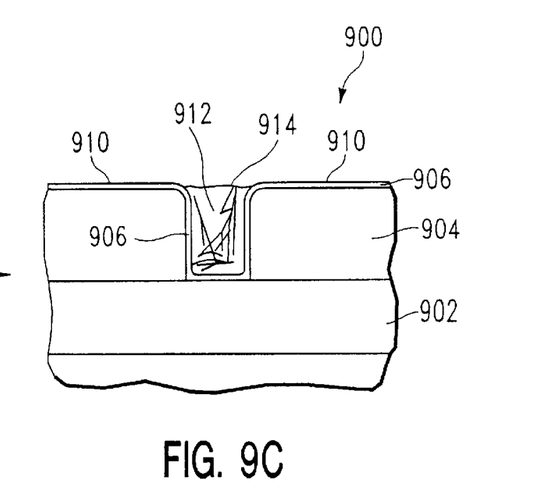

With reference to FIGS. 9A, 9B, and 9C, these figures are illustrative of a preferred copper etchback process which is based on physical bombardment combined with an etchant species which is chemically reactive with copper. The advantage of this method is that the etch rate of the copper can be substantially increased, reducing the etch time required. For example, typically the etch rate can be increased by a factor of 2 to 3 times by using a combination of non-reactive and reactive gases. With regard to reactive gases, halogen-based chemistry works well, but preferably the source of the reactive gas is a halogen-containing compound such as HCl, HBr, HI, $BCl_3$, $SiCl_4$, $CCl_4$, or the like rather than a pure halogen such as $Cl_2$. The aggressiveness of the halogen-containing compound is further modified using auxiliary non-reactive gases such as $N_2$, $H_2$, Ar, He, Xe, $CH_4$, $C_2H_6$, $C_3H_8$, and the like.

In this preferred embodiment, the plasma feed gas which supplied the reactive species was HCl; however, HCl, HBr, HI, $BCl_3$, $SiCl_4$, and combinations thereof may be used for the first etch step. In the second step it is preferred to use HBr alone; or a reactive gas such as HCl, HBr, or HI; in the alternative, a gas such as $BCl_3$, $SiCl_4$, or $CF_4$ may be used in combination with a non-reactive gas such as $N_2$, $H_2$, Ar, He, Xe, $CH_4$, $C_2H_6$, $C_3H_8$, for example, so that the tantalum or tantalum nitride layer will be less affected and the etched copper features will not be attacked.

The sample was etched in the Centura® Integrated Processing System previously described. The semiconductor structure 900 was a contact via having a diameter of about 0.3 microns and an aspect ratio of about 3:1. The contact via structure 900 included a silicon underlayer 902, an overlying silicon dioxide dielectric layer 904, a tantalum nitride barrier layer 906 overlying silicon dioxide layer 904, and a copper fill layer 908 overlying barrier layer 906. The etch process included two etch steps with different plasma feed gas compositions for each step. However, as one skilled in the art can anticipate, it would be possible to gradually change the gas composition over a time period (as an alternative to two discreet steps).

The first etch step conditions were as specified below. The plasma gas feed to the etch process chamber was about 100 sccm of HCl; the process chamber pressure was 20 mTorr; the source power was 1500 W at a frequency of 2 MHz; the bias power applied to the substrate support platen was about 500 W at a frequency of 13.56 MHz; and, the substrate surface temperature was approximately 250° C., while the etch chamber wall was about 80° C. FIG. 9B illustrates the change in via structure 900 after the first etch step. A thin layer 908b of copper covers the upper surface 910 of tantalum nitride barrier layer of the via structure 900. The etch time period was about 60 seconds, and the thickness of the copper layer overlying barrier layer 906 was decreased by about 0.7 microns.

The second etch step conditions were as specified below. The plasma gas feed to the etch process chamber was about 100 sccm of argon and 5 sccm of HCl; the process chamber pressure was 10 mTorr; the source power was 1000 W at a frequency of 2 MHz; the bias power applied to the substrate support platen was about 200 W at a frequency of 13.56 MHz; and, the substrate surface temperature was approximately 250° C., while the etch chamber wall was about 80° C. FIG. 9C illustrates the change in via structure 900 after the second etch step. The thin layer 908b of copper has been removed, exposing the upper surface 910 of tantalum nitride barrier layer of the via structure 900. The second etch time period was approximately 20 seconds, and the copper layer thickness removed was about 0.05 microns.

The two step etch back process required about 75 seconds. Photomicrographs of the upper surface of the structure show a clean tantalum nitride upper surface 910 with the copper plug 912 being slightly depressed (about 0.07 microns) below the upper surface 910.

EXAMPLE FIVE

Reactive Species Etchback Including Barrier Layer Removal

With reference to FIGS. 10A, 10B, 10C, and 10D, these figures are illustrative of a preferred copper etchback process which is based on physical bombardment combined with an etchant species which is chemically reactive with copper. The advantage of this method is that the etch rate of the copper can be substantially increased, and residual barrier layer on the dielectric surface can be removed in a single integrated process. In this preferred embodiment, the method included three steps. The plasma feed gas which supplied the reactive species was HCl for the first two steps; however, for the first step, HCl, HBr, $BCl_3$, and combinations thereof work well. The sample was etched in the Centura® Integrated Processing System previously described. The semiconductor structure 1000 was a contact via having a diameter of about 0.3 microns and an aspect ratio of about 3:1. The contact via structure 1000 included a silicon underlayer 1002, an overlying silicon dioxide dielectric layer 1004, a tantalum nitride barrier layer 1006 overlying silicon dioxide layer 1004, and a copper fill layer 1008 overlying barrier layer 1006. As one skilled in the art can anticipate, it would be possible to gradually change the gas composition over a time period (as an alternative to three discreet steps).

Figure 10A:
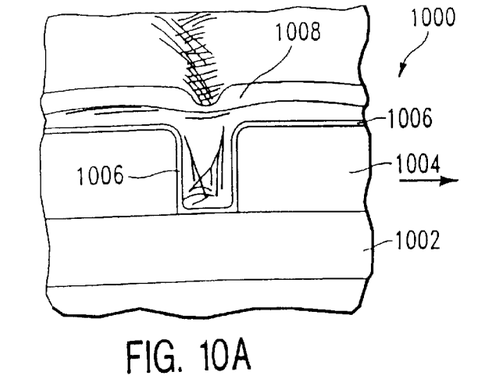
Figure 10B:
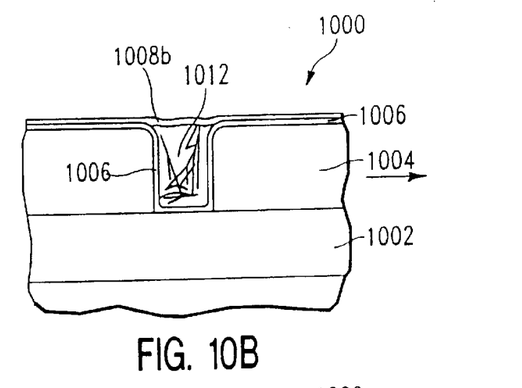

The first etch step conditions were as specified below. The plasma gas feed to the etch process chamber was about 100 sccm of HCl; however, HBr, $BCl_3$, or a $Cl_2$-comprising source gas could be used as well. The process chamber pressure was 20 mTorr; the source power was 1500 W at a frequency of 2 MHz; the bias power applied to the substrate support platen was about 500 W at a frequency of 13.56 MHz; and, the substrate surface temperature was approximately 250° C., while the etch chamber wall was about 80° C. FIG. 10B illustrates the change in via structure 600 after the first etch step. A thin layer 1008b of copper covers the upper surface 1010 of tantalum nitride barrier layer 1006 of the via structure 1000. The etch time period was about 64 seconds and the thickness of the copper layer 1008 overlying barrier layer 1006 was reduced by about 0.1 microns.

Figure 10C:
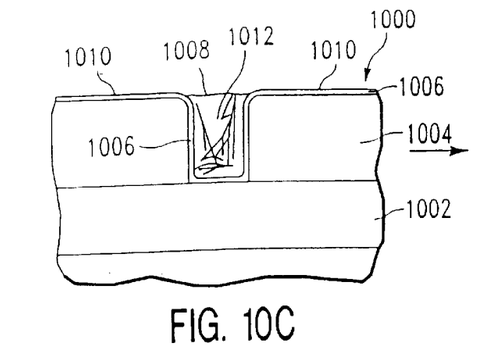

The second etch step conditions were as specified below. The plasma gas feed to the etch process chamber was about 100 sccm of argon and 5 sccm of HCl; however, the plasma feed gas for this step could also be 100 sccm of HCl with 10 sccm of $CH_4$ or 100 sccm of $BCl_3$ with 10 sccm of $CH_4$ (where $CH_4$ is used to slow down the etch rate and to improve selectivity toward copper). The process chamber pressure was 10 mTorr; the source power was 1000 W at a frequency of 2 MHz; the bias power applied to the substrate support platen was about 200 W at a frequency of 13.56 MHz; and, the substrate surface temperature was approximately 250° C., while the etch chamber wall was about 80° C. FIG. 10C illustrates the change in via structure 1000 after the second etch step. The thin layer 1008b of copper has been removed, exposing the upper surface 1010 of tantalum nitride barrier layer of the via structure 1000. The time period of the second etch period was about 20 seconds, and the thickness of the copper layer 1008b which was removed was about 0.05 microns.

Figure 10D:
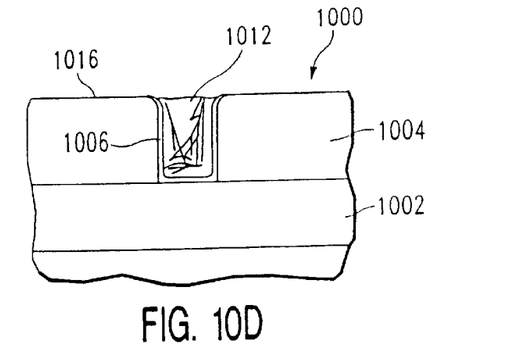

The third etch step conditions were as specified below. The plasma gas feed to the etch process chamber was about 100 sccm of argon and 5 sccm of $CHF_3$ (5 sccm of $CF_4$ could also have been used). The process chamber pressure was 10 mTorr; the source power was 1000 W at a frequency of 2 MHz; the bias power applied to the substrate support platen was about 200 W at a frequency of 13.56 MHz; and, the substrate surface temperature was approximately 250° C., while the etch chamber wall was about 80° C. FIG. 10D illustrates the change in via structure 1000 after the third etch step. The tantalum nitride barrier layer 1006 on the upper surface 1016 of silicon dioxide layer 1004 has been removed, leaving barrier layer 1006 lining the interior of the via and covered by copper plug 1012. The etch time period was about 18 seconds for removal of tantalum nitride barrier layer 1006 which was about 0.05 microns thick.

Figure 11:
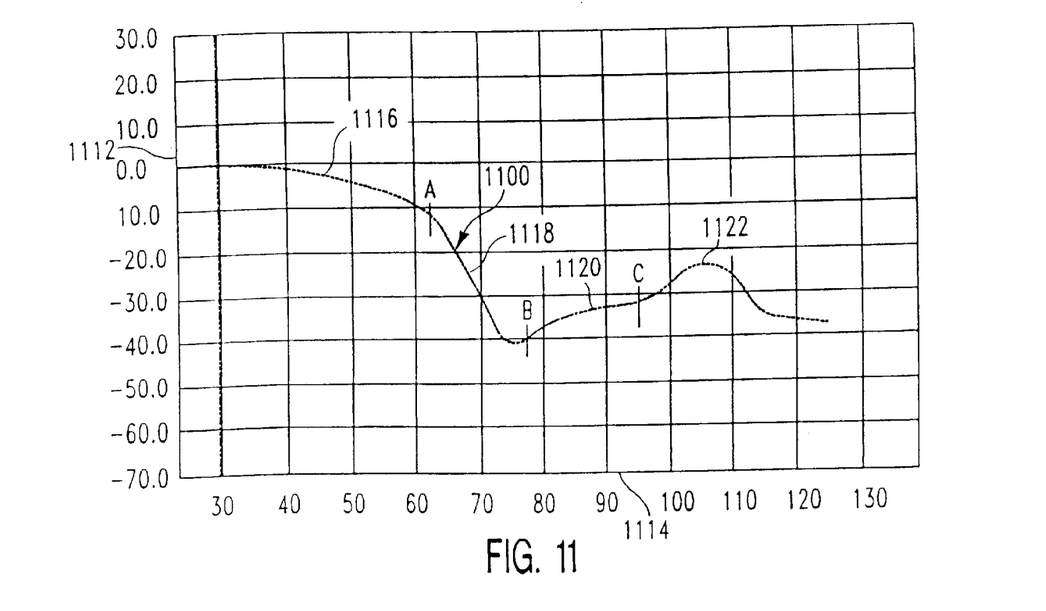
FIG. 11 is a graph showing the concentration of copper in the vapor space over the substrate during the three etch steps represented by the change in structure between FIGS. 10A and 10B; between FIGS. 10B and 10C; and between FIGS. 10C and 10D. In addition, the graph shows at least one unidentified species in the vapor space which was generated by a thermal treatment of the structure shown in FIG. 10D, for purposes of removal of potentially corrosive reactants from the etched copper surface.

FIG. 11 illustrates the copper emissions during the first two etch steps and the tantalum nitride emissions during the third step. The copper concentration was monitored using an optical sensor measuring at a wavelength of about 3,250 Å.

Curve 1100 represents the optical emission intensity 1112 for copper appearing in the vapor space over the substrate, as a function of time 1114 in seconds. The intensity reading for the copper drops off gradually during the first etch step (labeled 1116 on Curve 1100, and ending at point A) which occurred over a time period of about 64 seconds. The plasma source gas during this first etch step was 100 sccm of Ar and 100 sccm of HCl. During this etch step, approximately 0.5 microns of the thickness of copper layer 1108 was removed. The intensity reading for the copper drops off more rapidly during the second step etch (labeled 1118 on Curve 1100, and ending at point B) which occurred over a time period of about 12 seconds, as copper was disappearing from some areas of the surface 1110 of barrier layer 1106. The plasma source gas during this second etch step was 100 sccm Ar, 50 sccm HCl, and 5 sccm $CH_4$. During the third etch step for removal of the tantalum nitride barrier layer 1106 overlying the upper surface 1116 of the silicon dioxide layer 1104 (labeled 1120 on Curve 1100, and ending at point C), a small amount of copper emissions 1116 were generated, indicating removal of a minor amount of copper from copper plug 1012. During this third etch step, the plasma source gas was 50 sccm $CHF_3$ and 10 sccm Ar. Photomicrographs of the upper surface of the structure show a clean silicon dioxide upper surface 1016, with the copper plug 1012 being slightly depressed (about 0.07 microns below the upper surface 1016). Subsequent to the three etch steps, a fourth step was carried out to volatilize materials on the surface of the substrate which might cause corrosion of the etched copper surface. The substrate was heated to a temperature of about 250° C. The substrate was exposed to a plasma generated using a plasma gas source of 100 sccm Ar and 10 sccm $CH_4$. The plasma source power was about 1500 W and the substrate support platen bias power was 400 W. The time period of exposure to the plasma was about 15 seconds. The portion of Curve 1100 labeled 1122 is representative of the emissions of unknown species which were volatilized.

The above description provides numerous specific detail such as material types and process conditions, and such to enable an understanding of the present invention. It will be obvious, however, to one skilled in the art that the present invention may be practiced in other instances using well-known semiconductor manufacturing processes. The above description is not intended to unnecessarily limit the scope of the present invention, which is better illustrated in view of the claims below.

We claim:

1. A method useful in the etchback of copper interconnect layers at temperatures below about 150° C., said method comprising the steps of:
   a) supplying to a plasma etch process chamber at least one gas, which gas is chemically non-reactive with copper;
   b) creating a plasma from said at least one gas in a manner which provides a uniform ion density across the substrate surface;
   c) attracting ions and excited atoms from said plasma toward a substrate surface comprising a layer of copper by applying an offset bias to said substrate; and
   d) removing at least portions of said copper layer deposited on said substrate surface while maintaining a portion of said copper layer interior of said substrate surface.

2. The method of claim 1, wherein said plasma created in step b) is sufficient to enable a copper etch rate of at least 1,000 Å per minute.

3. The method of claim 1, wherein said substrate temperature is about 80° C. or less.

4. A method useful in the etchback of copper interconnect layers at temperatures higher than about 150° C., said method comprising the steps of:
   a) supplying to a plasma etch process chamber at least one gas, which gas is selected to provide the desired copper etch rate and selectivity for copper over adjacent substrate materials, while avoiding or reducing corrosion of the etched copper surface;
   b) creating a plasma from said gases described in step a) in a manner which provides a uniform ion density across the substrate surface;
   c) attracting ions and excited atoms from the plasma toward a substrate surface which comprises a layer of copper, by applying an offset bias to said substrate; and
   d) removing at least a portion of said copper layer deposited on said substrate surface while maintaining a portion of said copper layer interior of said substrate surface.

5. The method of claim 4, wherein said plasma created in step b) is sufficient to enable a copper etch rate of at least 1,000 Å per minute.

6. The method of claim 4, wherein said at least one gas is a non-reactive gas.

7. The method of claim 4, wherein said at least one gas is a reactive gas which provides a species which reacts with copper.

8. The method of claim 4, wherein said at least one gas includes both a non-reactive gas and a reactive gas.

9. The method of claim 4, wherein the substrate temperature ranges from higher than about 150° C. to about 400° C.

10. The method of claim 4 or claim 5, including an additional step e) removing at a portion of a barrier layer exposed by the removal of said copper layer.

11. The method of claim 4, wherein said substrate is silicon dioxide or a low K dielectric.

12. The method of claim 10, wherein said substrate is silicon dioxide or a low K dielectric.

13. The method of claim 4, or claim 5, or claim 6, or claim 7, or claim 8, or claim 9, wherein said first portion of said copper layer is removed using a first at least one plasma source gas designed for rapid removal of a copper layer, while a second portion of said copper layer is removed using a second at least one gas designed for a less rapid removal of said copper layer, to selectively remove copper more rapidly than adjacent substrate and barrier materials, and to reduce corrosion of an etched copper surface.

14. The method of claim 4 or claim 5, including an additional step for removal of corrosive materials from an etched copper surface.

15. The method of claim 13, including an additional step for removal of corrosive materials from an etched copper surface.

16. The method of claim 4 or claim 5 or claim 7, wherein said at least one gas which is chemically reactive with copper is selected from the group consisting of HCl, HBr, HI, $BCl_3$, $SiCl_4$, and combinations thereof.

17. The method of claim 4 or claim 5 or claim 7, wherein said at least one gas which is chemically reactive with copper is selected from the group consisting of HCl, HBr, HI, and combinations thereof.

18. A method useful in the etchback of copper interconnect layers comprising the steps of:
   a) supplying to a plasma etch process chamber at least one gas which gas is chemically non-reactive with copper and at least one gas which is chemically reactive with copper;

b) creating a plasma from the gases described in step a) in a manner which provides a uniform ion density across the substrate surface;

c) attracting ions and excited atoms from the plasma toward the substrate surface by applying an offset bias to the substrate; and d) removing a first portion of a copper layer overlying said substrate surface while maintaining a second portion of said copper layer overlying said substrate surface and while a portion of said copper layer interior of said substrate surface;

e) removing said second portion of said copper layer overlying said substrate surface while maintaining a portion of said copper layer interior of said substrate surface; and f) removing a barrier layer overlying said substrate surface while maintaining the portion of said copper layer and said barrier layer interior of the substrate surface.

19. The method of claim 18, wherein the plasma created in step b) is sufficient to enable a copper etch rate of at least 1,000 Å per minute.

20. The method of claim 18, wherein the substrate temperature is greater than about 150° C.

21. The method of claim 18 or claim 19 or claim 20, wherein said first portion of said copper layer is removed using a first combination of gases designed for rapid removal of the copper layer, while said second portion of the copper layer is removed using a second combination of gases designed for a less rapid removal of said copper layer and for selectivity toward copper, while avoiding corrosion of an etched copper surface, and further removing said barrier layer using a third combination of gases designed for removal of said barrier layer while avoiding the corrosion of or while passivating said etched copper surface.

22. The method of claim 18 or claim 19 or claim 20, wherein said at least one gas which is chemically reactive with copper during the removal of said first portion of said copper layer is selected from a first group consisting of HCl, HBr, HI, $SiCl_4$, $BCl_3$, $CHF_3$, $CF_4$, $SF_6$, $Cl_2$, and combinations thereof, and wherein said at least one gas which is chemically reactive with copper during the removal of said second portion of said copper layer is selected from a second group consisting of HCl, HBr, HI, and combinations thereof.

23. The method of claim 18 or claim 19 or claim 20, wherein said at least one gas which is chemically reactive with copper during the removal of said first portion of said copper layer is selected from a first group consisting of HCl, HBr, HI, $SiCl_4$, $BCl_3$, $CHF_3$, $CF_4$, $SF_6$, $Cl_2$, and combinations thereof, and wherein said at least one gas which is chemically reactive with copper during the removal of said second portion of said copper layer is selected from a second group of reactive gases consisting of HCl, HBr, HI, $SiCl_4$, $BCl_3$, and combinations thereof in the presence of at least one non-reactive gas selected from the group consisting of $N_2$, $H_2$, Ar, He, Xe, $CH_4$, $C_2H_6$, $C_3H_8$, and combinations thereof.

* * * * *